United States Patent
Dietz et al.

(10) Patent No.: US 10,290,601 B2
(45) Date of Patent: May 14, 2019

(54) METHOD OF MANUFACTURING BONDED BODY

(71) Applicant: NAMICS CORPORATION, Niigata-shi, Niigata (JP)

(72) Inventors: Raymond Dietz, Byfield, MA (US); Cathy Shaw Trumble, Barrington, NH (US); Maciej Patelka, San Jose, CA (US); Akito Yoshii, Niigata (JP); Noriyuki Sakai, Niigata (JP); Hiroshi Yamaguchi, Niigata (JP)

(73) Assignee: NAMICS CORPORATION, Niigata (JP)

( * ) Notice: Subject to any disclaimer, the term of this patent is extended or adjusted under 35 U.S.C. 154(b) by 29 days.

(21) Appl. No.: 15/564,674

(22) PCT Filed: Apr. 6, 2016

(86) PCT No.: PCT/JP2016/061195
§ 371 (c)(1),
(2) Date: Oct. 5, 2017

(87) PCT Pub. No.: WO2016/163377
PCT Pub. Date: Oct. 13, 2016

(65) Prior Publication Data
US 2018/0082972 A1    Mar. 22, 2018

Related U.S. Application Data

(60) Provisional application No. 62/145,250, filed on Apr. 9, 2015.

(51) Int. Cl.
*H01L 21/00* (2006.01)
*H01L 23/00* (2006.01)
(Continued)

(52) U.S. Cl.
CPC .............. *H01L 24/29* (2013.01); *C03C 3/122* (2013.01); *C03C 3/14* (2013.01); *C03C 3/21* (2013.01);
(Continued)

(58) Field of Classification Search
CPC ......... H01L 21/52; H01L 23/40; H01L 24/29; H01L 24/83; C03C 3/122; C03C 3/14;
(Continued)

(56) References Cited

U.S. PATENT DOCUMENTS

| 5,334,558 A | 8/1994 | Dietz et al. |
| 5,543,366 A | 8/1996 | Dietz et al. |

(Continued)

FOREIGN PATENT DOCUMENTS

| JP | 08502468 A | 3/1996 |
| JP | 11054531 A | 2/1999 |

(Continued)

OTHER PUBLICATIONS

International Search Report (ISR) and Written Opinion dated Jun. 14, 2016 issued in International Application No. PCT/JP2016/061195.

*Primary Examiner* — Brook Kebede
(74) *Attorney, Agent, or Firm* — Holtz, Holtz & Volek PC

(57) ABSTRACT

A method of manufacturing a bonded body in which a first body and a second body are bonded using a glass paste. The glass paste includes a crystallized glass frit (A) and a solvent (B). A remelting temperature of the crystallized glass frit (A) is higher than a crystallization temperature thereof which is higher than a glass transition temperature thereof. The method includes: applying the glass paste on at least one of the first and second bodies, bonding the first and second bodies by interposing the glass paste therebetween, heating the bonded first and second bodies to a temperature that is
(Continued)

not lower than the crystallization temperature and lower than the remelting temperature of the crystallized glass frit (A), and obtaining the bonded body by cooling the bonded first and second bodies to a temperature that is not higher than the glass transition temperature of the crystallized glass frit.

19 Claims, 2 Drawing Sheets

(51) Int. Cl.
| | | |
|---|---|---|
| H01L 23/40 | (2006.01) | |
| H01L 21/52 | (2006.01) | |
| C03C 4/14 | (2006.01) | |
| C03C 8/02 | (2006.01) | |
| C03C 8/08 | (2006.01) | |
| C03C 8/24 | (2006.01) | |
| C03C 10/00 | (2006.01) | |
| C03C 3/12 | (2006.01) | |
| C03C 3/14 | (2006.01) | |
| C03C 3/21 | (2006.01) | |
| C03C 8/18 | (2006.01) | |
| C03C 27/04 | (2006.01) | |

(52) U.S. Cl.
CPC ............... *C03C 4/14* (2013.01); *C03C 8/02* (2013.01); *C03C 8/08* (2013.01); *C03C 8/18* (2013.01); *C03C 8/24* (2013.01); *C03C 10/00* (2013.01); *C03C 27/044* (2013.01); *H01L 21/52* (2013.01); *H01L 23/40* (2013.01); *H01L 24/83* (2013.01); *C03C 2204/00* (2013.01); *C03C 2205/00* (2013.01); *H01L 2224/29188* (2013.01); *H01L 2224/8389* (2013.01); *H01L 2924/0535* (2013.01); *H01L 2924/0541* (2013.01); *H01L 2924/05994* (2013.01); *H01L 2924/20104* (2013.01); *H01L 2924/20105* (2013.01)

(58) Field of Classification Search
CPC .... C03C 3/21; C03C 4/14; C03C 8/02; C03C 8/08; C03C 8/18; C03C 8/24; C03C 10/00; C03C 27/044; E06B 3/6612; E06B 3/6775
USPC ......................................... 438/119, 406, 455
See application file for complete search history.

(56) References Cited

U.S. PATENT DOCUMENTS

| | | | |
|---|---|---|---|
| 2012/0178207 A1* | 7/2012 | Jiang | H01L 31/022425 438/98 |
| 2013/0115460 A1* | 5/2013 | Yamada | C03C 8/04 428/402 |
| 2015/0008573 A1 | 1/2015 | Sawai et al. | |
| 2016/0052820 A1 | 2/2016 | Dietz et al. | |

FOREIGN PATENT DOCUMENTS

| | | |
|---|---|---|
| JP | 2009026965 A | 2/2009 |
| JP | 2013151396 A | 8/2013 |
| WO | 2014119579 A1 | 8/2014 |

* cited by examiner

METHOD OF MANUFACTURING BONDED BODY

CROSS-REFERENCE TO RELATED APPLICATIONS

This application is a United States National Phase application under 35 USC 371 of International Application No. PCT/JP2016/061195, filed Apr. 6, 2016, which claims the benefit under 35 USC 119(e) of U.S. Provisional Patent Application No. 62/145,250, filed Apr. 9, 2015.

TECHNICAL FIELD

The present invention relates to a method of manufacturing a bonded body in which a first body to be bonded and a second body to be bonded are bonded using a glass paste.

BACKGROUND ART

Pastes containing glass and electrically conductive particles are used as bonding materials to bond a substrate and a semiconductor chip, a substrate and a cover body, a substrate and a heat radiation member, and the like. For example, pastes containing glass and electrically conductive particles are used as die bonding materials to bond a semiconductor element, such as a semiconductor chip, on a circuit layer bonded on a ceramic substrate. Patent Literature 1 discloses a die bonding material paste containing a $V_2O_5$-containing lead-free glass and 30 to 95% by volume of metal particles. Patent Literature 1 discloses, as a glass contained in the die bonding material paste, a glass that has a total amount of 65% by mass of $V_2O_5$ and $Ag_2O$ in a glass composition and that has a glass transition temperature (Tg) of 163° C., a glass crystallization temperature (Tcry) of 263° C., and a softening point (Ts) of 208° C.

Furthermore, Patent Literature 2 discloses a glass paste for bonding a semiconductor device to a substrate, the glass paste using a glass powder that has a specific composition and having a glass transition temperature of approximately 250° C. or lower, a crystallization temperature of 300° C. or lower, and a crystal-remelting temperature of approximately 350° C. or lower. The glass contained in the glass paste disclosed in Patent Literature 2 contains, based on oxides, 46.9% by weight of $Ag_2O$, 22.0% by weight of $V_2O_5$, 8.9% by weight of $TeO_2$, and 22.2% by weight of $PbO_2$. It is disclosed that the fine powder glass containing this glass composition has a glass transition temperature (Tg) of 152.4° C., a glass crystallization peak temperature (Tc) of 199.2° C., and a glass-remelting peak temperature (Tr) of 275.8° C., determined by DSC analysis.

PRIOR ART DOCUMENTS

Patent Literatures

Patent Literature 1: JP 2013-151396 A
Patent Literature 2: JP H08-502468 A

SUMMARY OF THE INVENTION

Problems to be Solved by the Invention

Patent Literature 1 does not describe the glass-remelting temperature. Furthermore, in the die bonding material paste described in Patent Literature 1, the crystallization temperature of the glass contained in the paste is 263° C. or higher and, for example, it is described that the die bonding material paste is pre-sintered at 350° C. or 450° C. Patent Literature 2 also discloses a method of bonding a semiconductor element to a substrate, in which a glass paste interposed between the semiconductor element and the substrate is heated to a temperature that is not lower than the remelting temperature of the glass contained in the glass paste, e.g., 350° C. or 450° C.

However, when a semiconductor element and a substrate are bonded by being heated to a temperature that is not lower than the remelting temperature of the glass contained in the glass paste, the semiconductor element may be damaged by the heating. Therefore, a method in which a semiconductor element and a substrate are bonded by heating at an even lower temperature has been desired.

As described above, there has been a demand for a glass paste that can bond adherends by being heated at an even lower temperature, considering suppression of the damage to the semiconductor element by the heating, waste of the energy used in high temperature heating, and the like. When the adherends is a semiconductor element for a power device, capability of bonding the adherends when heated at a low temperature is required, and high heat resistance is required for a bonded body such as a semiconductor module.

To solve the problems described above, an object of the present invention is to provide a method of manufacturing a bonded body, by which a first body to be bonded and a second body to be bonded can be bonded by means of heating at a relatively low temperature and by which a bonded body having excellent heat resistance can be obtained after the bonding.

Means for Solving the Problems

To solve the problems described above, the inventors of the present invention found that a first body to be bonded and a second body to be bonded can be bonded by interposing a glass paste containing a crystallized glass frit having a glass transition temperature (Tg), a crystallization temperature (Tc), and a remelting temperature (Tr) between the first body to be bonded and the second body to be bonded, and heating at a temperature that is not lower than the crystallization temperature (Tc) and lower than the remelting temperature (Tr). The inventors of the present invention found that the bonded body of the first body to be bonded and the second body to be bonded obtained as described above exhibits excellent heat resistance, and thus completed the present invention.

[1] The present invention relates to a method of manufacturing a bonded body in which a first body to be bonded and a second body to be bonded are bonded using a glass paste, the method comprising: a step of applying the glass paste on the first body to be bonded and/or the second body to be bonded, the glass paste containing a crystallized glass frit (A) and a solvent (B), the crystallized glass frit (A) having a glass transition temperature (Tg), a crystallization temperature (Tc), and a remelting temperature (Tr), the remelting temperature (Tr) being a temperature higher than the crystallization temperature (Tc), and the crystallization temperature (Tc) being a temperature higher than the glass transition temperature (Tg), a step of bonding the first body to be bonded and the second body to be bonded by interposing the glass paste therebetween, a step of heating the first body to be bonded and the second body to be bonded that are bonded via the glass paste to a temperature that is not lower than the crystallization temperature (Tc) and lower than the remelting temperature (Tr) of the crystallized glass frit (A), and a step of obtaining a bonded body by cooling the first body to be bonded and the second body to be bonded that are bonded via the glass paste to a temperature that is not higher than the glass transition temperature of the crystallized glass frit.

[2] The present invention relates to the method of manufacturing a bonded body described in [1], wherein the glass paste further contains an electrically conductive particle (C).

[3] The present invention relates to the method of manufacturing a bonded body described in [1] or [2], wherein the remelting temperature (Tr) of the crystallized glass frit (A) is 300° C. or higher.

[4] The present invention relates to the method of manufacturing a bonded body described in any one of [1] to [3], wherein a difference between the glass transition temperature (Tg) and the crystallization temperature (Tc) of the crystallized glass frit (A) is 30° C. to 185° C.

[5] The present invention relates to the method of manufacturing a bonded body described in any one of [1] to [4], wherein the crystallization temperature (Tc) of the crystallized glass frit (A) is 150° C. to 350° C.

[6] The present invention relates to the method of manufacturing a bonded body described in any one of [1] to [5], wherein the glass transition temperature (Tg) of the crystallized glass frit (A) is 110° C. or higher and lower than 200° C.

[7] The present invention relates to the method of manufacturing a bonded body described in any one of [1] to [6], wherein the crystallized glass frit (A) contains $Ag_2O$ and $V_2O_5$.

[8] The present invention relates to the method of manufacturing a bonded body described in [7], wherein the crystallized glass fit (A) contains at least one type of oxide selected from a group consisting of $TeO_2$, $MoO_3$, $MnO_3$, $ZnO$, $CuO$, $TiO_2$, $MgO$, $Nb_2O_5$, $BaO$, $Al_2O_3$, $SnO$, and $Fe_2O_3$.

[9] The present invention relates to the method of manufacturing a bonded body described in [7] or [8], wherein the crystallized glass frit (A) contains a total amount of 80 to 96% by mass of $Ag_2O$ (A-1) and $V_2O_5$ (A-2) in terms of oxides with respect to the total mass of the crystallized glass frit, and a mass ratio ($Ag_2O/V_2O_5$) of $Ag_2O$ (A-1) to $V_2O_5$(A-2) is 1.8 to 3.2.

[10] The present invention relates to the method of manufacturing a bonded body described in any one of [1] to [6], wherein the crystallized glass frit (A) contains $Ag_2O$ and $TeO_2$.

[11] The present invention relates to the method of manufacturing a bonded body described in [10], wherein the crystallized glass frit (A) contains at least one type of oxide selected from a group consisting of $MoO_3$, $MnO_3$, $ZnO$, $CuO$, $TiO_2$, $MgO$, $Nb_2O_5$, $BaO$, $Al_2O_3$, $SnO$, $B_2O_3$, and $Fe_2O_3$.

[12] The present invention relates to the method of manufacturing a bonded body described in any one of [1] to [11], wherein the first body to be bonded is a substrate and the second body to be bonded is a semiconductor chip.

[13] The present invention relates to the method of manufacturing a bonded body described in any one of [1] to [11], wherein the first body to be bonded is a substrate and the second body to be bonded is a cover body.

The present invention relates to the method of manufacturing a bonded body described in any one of [1] to [11], wherein the first body to be bonded is a substrate or a semiconductor chip and the second body to be bonded is a cover body heat radiation member.

Effect of the Invention

The present invention can bond a first body to be bonded and a second body to be bonded at a relatively low temperature, e.g., a heating temperature of 450° C. or lower, by a step of heating the first body to be bonded and the second body to be bonded, between which a glass paste is interposed, to a temperature that is not lower than a crystallization temperature (Tc) and lower than a remelting temperature (Tr) of the crystallized glass frit (A), the crystallized glass frit (A) contained in the glass paste having a glass transition temperature (Tg), the crystallization temperature (Tc), and the remelting temperature (Tr). After the bonding of the first body to be bonded and the second body to be bonded, a bonded body having excellent heat resistance can be obtained.

MODE FOR CARRYING OUT THE INVENTION

Figure 1:
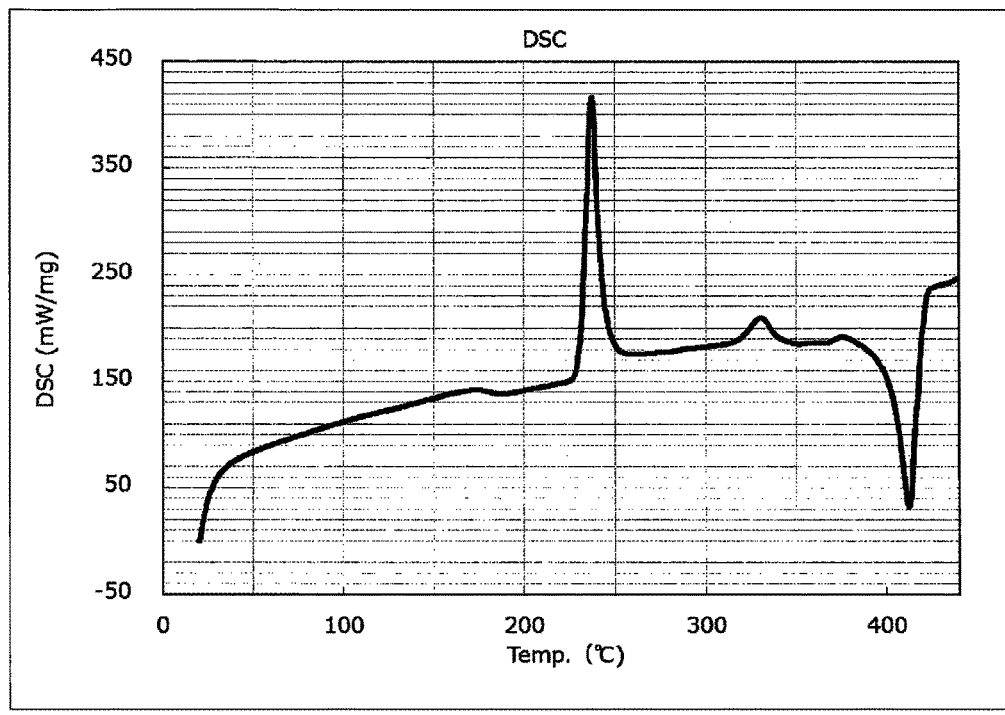
FIG. 1 is a DSC chart of a crystallized glass frit 1 used in the manufacturing method of an Example of an embodiment of the present invention, measured using a differential scanning calorimeter.

The present invention relates to a method of manufacturing a bonded body in which a first body to be bonded and a second body to be bonded are bonded using a glass paste. The glass paste contains a crystallized glass frit (A) and a solvent (B). The crystallized glass frit (A) has a glass transition temperature (Tg), a crystallization temperature (Tc), and a remelting temperature (Tr). The remelting temperature (Tr) is a temperature exceeding the crystallization temperature (Tc). The crystallization temperature (Tc) is a temperature exceeding the glass transition temperature (Tg). The manufacturing method of the present invention includes a step of applying the glass paste to the first body to be bonded and/or the second body to be bonded. The manufacturing method of the present invention include a step of bonding the first body to be bonded and the second body to be bonded by interposing the glass paste therebetween. The manufacturing method of the present invention include a step of heating the first body to be bonded and the second body to be bonded that are bonded via the glass paste to a temperature that is not lower than the crystallization temperature (Tc) and lower than the remelting temperature (Tr) of the crystallized glass frit (A). The manufacturing method of the present invention include a step of obtaining a bonded body by cooling the first body to be bonded and the second body to be bonded that are bonded via the glass paste to a temperature that is not higher than the glass transition temperature of the crystallized glass frit.

Crystallized Glass Frit (A)

In the present invention, the crystallized glass frit (A) contained in the glass paste is preferably a powder glass having an average particle diameter (median diameter) based on the volume of 1 to 200 μm. The average particle diameter of the crystallized glass frit is more preferably 3 to 180 μm, even more preferably 3 to 160 μm, and particularly preferably 5 to 150 μm. The crystallized glass frit (A) can be obtained as follows. Raw materials are placed in a porcelain crucible and heat-melted in a melting furnace (oven) to obtain a glass melt. This glass melt is then poured between stainless steel rollers and formed into a sheet shape. The obtained sheet-like glass is crushed in a mortar and classified using, for example, 100-mesh and 200-mesh test sieves. The crystallized glass frit (A) can be obtained as described above. The size of the mesh of the test sieve is not particularly limited. By the classification using a test sieve having a small mesh size, crystallized glass frit having an even smaller average particle diameter (median diameter) can be obtained. The average particle diameter of the crystallized glass frit can be measured using a laser diffraction/scattering particle diameter/particle size distribution measuring apparatus (e.g., MICROTRAC HRA9320-X100, manufactured by Nikkiso Co., Ltd.). The average particle diameter of the crystallized glass frit refers to a volume cumulative distribution D50 (median diameter).

The crystallized glass refers to those having a structure in which molecules are arranged regularly (crystal) in an amorphous glass having a random molecular arrangement. In the present description, the crystallized glass frit refers to those having at least one exothermic peak that indicates a crystallization temperature (Tc) in a temperature region higher than the glass transition temperature (Tg) in the DSC chart measured by a differential scanning calorimeter. Furthermore, in the present invention, the crystallized glass frit (A) contained in the glass paste has at least one endothermic peak that indicates a remelting temperature (Tr) in a temperature region higher than the crystallization temperature (Tc) in the DSC chart measured by a differential scanning calorimeter.

The remelting temperature (Tr) of the crystallized glass frit (A) refers to a temperature of at least one endothermic peak shown in the temperature region exceeding the crystallization temperature (Tc) in the DSC chart measured by a differential scanning calorimeter. The remelting temperature (Tr) of the crystallized glass frit (A) is preferably higher than the temperature region at which the bonded body is used. In the DSC chart of the crystallized glass frit (A) measured by a differential scanning calorimeter, if a plurality of endothermic peaks are present in the temperature region higher than the crystallization temperature (Tc), the lowest endothermic peak is preferably higher than the temperature region in which the bonded body is used. Since a semiconductor chip with silicon carbide, gallium nitride and the like can operate at a high temperature compared to conventional silicon chips, the remelting temperature (Tr) of the crystallized glass frit (A) is preferably 300° C. or higher, more preferably 350° C. or higher, and even more preferably 400° C. or higher. Furthermore, in the manufacturing method of the present invention, the glass paste interposed between the first body to be bonded and the second body to be bonded is heated at a temperature that is not lower than the crystallization temperature (Tc) and lower than the remelting temperature (Tr) of the crystallized glass frit (A) contained in the glass paste. Therefore, the first body to be bonded and the second body to be bonded can be bonded without remelting the crystallized molecular arrangement. As a result, heat resistance of the bonded body can be enhanced since the glass paste interposed between the first body to be bonded and the second body to be bonded contains the glass frit having, as a part thereof, a crystal in which the molecules are regularly arranged.

The crystallization temperature (Tc) of the crystallized glass frit (A) is preferably 150° C. to 350° C. The crystallization temperature (Tc) of the crystallized glass frit (A) refers to a temperature of exothermic peak that is present in the temperature region exceeding the glass transition temperature (Tg) and lower than the remelting temperature (Tr) in the DSC chart measured by a differential scanning calorimeter. In the DSC chart of the crystallized glass frit (A) measured in the differential scanning calorimeter, when a plurality of exothermic peaks is present in the temperature region exceeding the glass transition temperature (Tg) and lower than the remelting temperature (Tr), at least one exothermic peak having the numerical value of the absolute value of the exothermic quantity (J/g) of 15 J/g or more, preferably 20 J/g or more, and more preferably 30 J/g or more, is present in the range of preferably 150° C. to 350° C., more preferably 180° C. to 340° C., and even more preferably 200° C. to 340° C. When the crystallization temperature (Tc) of the crystallized glass frit (A) is 150° C. to 350° C., the temperature difference exists between the remelting temperature (Tr) and the crystallization temperature (Tc). Therefore, due to the heating to a temperature not lower than the crystallization temperature (Tc) and lower than the remelting temperature (Tr), a bonded body, in which the first body to be bonded and the second body to be bonded are bonded without melting the crystal deposited in the crystallized glass frit (A), can be formed. Furthermore, the bonded body can be formed by the heating at a relatively low temperature. As a result, the heat resistance of the bonded body can be enhanced.

The difference between the crystallization temperature (Tc) and the remelting temperature (Tr) of the crystallized glass frit (A) is not particularly limited, it is preferably 50 to 200° C., more preferably 60 to 190° C., and even more preferably 70 to 185° C. When the difference of the crystallization temperature (Tc) and the remelting temperature (Tr) of the crystallized glass frit (A) is 50 to 200° C., with the glass paste containing the crystallized glass fit (A), a bonded body can be formed by the heating at a relatively low temperature, and thus damage to the adherends due to the heating can be reduced.

The glass transition temperature (Tg) of the crystallized glass frit (A) is preferably 110° C. or higher and lower than 200° C. The glass transition temperature (Tg) of the crystallized glass frit (A) is more preferably 120° C. to 180° C., and even more preferably 150° C. to 180° C. When the glass transition temperature (Tg) of the crystallized glass frit (A) is 110° C. or higher and lower than 200° C., the temperature difference with respect to the crystallization temperature (Tc) is relatively small, and the heating temperature of not lower than the crystallization temperature (Tc) and lower than the remelting temperature (Tr) can be set to a relatively low temperature. Therefore, the damage to the adherends during the heating can be suppressed.

The difference between the glass transition temperature (Tg) and the crystallization temperature (Tc) of the crystallized glass fit (A) is preferably 30 to 70° C., more preferably 35 to 65° C., even more preferably 40 to 60° C., and particularly preferably 45 to 55° C. When the difference between the glass transition temperature (Tg) and the crystallization temperature (Tc) of the crystallized glass frit (A) is 30 to 70° C., a large amount of structures in which the molecules are regularly arranged (crystal) is contained in the crystallized glass frit (A). Therefore, the glass paste containing the crystallized glass frit (A) can form a bonded body by bonding the first body to be bonded and the second body to be bonded at a relatively low temperature. As a result, the heat resistance of the obtained bonded body can be enhanced. In the DSC chart of the crystallized glass frit (A) measured by a differential scanning calorimeter, preferably, no endothermic peak exists between the glass transition temperature (Tg) and the crystallization temperature (Tc). When no endothermic peak exists between the glass transition temperature (Tg) and the crystallization temperature (Tc), heat resistance of the obtained bonded body can be enhanced.

the crystallized glass frit (A) preferably contains $Ag_2O$ and $V_2O_5$. The crystallized glass frit (A) preferably further contains at least one type of oxide selected from a group consisting of $TeO_2$, $MoO_3$, $MnO_3$, ZnO, CuO, $TiO_2$, MgO, $Nb_2O_5$, BaO, $Al_2O_3$, and $Fe_2O_3$.

the crystallized glass frit (A) preferably contains a total amount of 80 to 96% by mass of $Ag_2O$ (A-1) and $V_2O_5$ (A-2) in terms of oxides with respect to the total amount of the crystallized glass frit (A), and a mass ratio ($Ag_2O/V_2O_5$) of $Ag_2O$ (A-1) to $V_2O_5$(A-2) is preferably 1.8 to 3.2. In the present description, each component contained in the crystallized glass frit (A) is described in "% by mass" with respect to the total mass of the crystallized glass frit (A) in terms of oxide, unless otherwise specified.

In the crystallized glass frit (A), the total amount of $Ag_2O$ (A-1) and $V_2O_5$ (A-2) is more preferably 82 to 95% by mass with respect to the total mass of the crystallized glass frit (A). Furthermore, in the crystallized glass frit (A), the mass ratio ($Ag_2O/V_2O_5$) of $Ag_2O$ (A-1) to $V_2O_5$(A-2) is preferably 1.8 to 3.2, more preferably 1.95 to 2.7, even more preferably 1.95 to 2.6, and particularly preferably 2.0 to 2.5. When the total amount of the component (A-1) and the component (A-2) contained in the crystallized glass frit (A) is 80 to 96% by mass and the mass ratio ($Ag_2O/V_2O_5$) of $Ag_2O$ (A-1) to $V_2O_5$(A-2) is 1.8 to 3.2, a crystallized glass frit (A) having a relatively low remelting temperature (Tr), which is higher than 350° C. and 450° C. or lower, can be obtained.

the crystallized glass frit (A) may further contain (A-3) at least one type of oxide selected from a group consisting of $TeO_2$, $MoO_3$, $MnO_3$, ZnO, CuO, $TiO_2$, MgO, $Nb_2O_5$, BaO, $Al_2O_3$, SnO, and $Fe_2O_3$.

the crystallized glass frit (A) may contain two or more types of oxides selected from the group consisting of $TeO_2$, $MoO_3$, $MnO_3$, ZnO, CuO, $TiO_2$, MgO, $Nb_2O_5$, BaO, $Al_2O_3$, SnO, and $Fe_2O_3$.

the crystallized glass frit (A) preferably contains $Ag_2O$ and $TeO_2$.

the crystallized glass frit (A) contains at least one type of oxide selected from a group consisting of $MoO_3$, $MnO_3$, ZnO, CuO, $TiO_2$, MgO, $Nb_2O_5$, BaO, $Al_2O_3$, SnO, $B_2O_3$, and $Fe_2O_3$.

the crystallized glass frit (A) contains two or more types of oxides selected from the group consisting of $MoO_3$, $MnO_3$, ZnO, CuO, $TiO_2$, MgO, $Nb_2O_5$, BaO, $Al_2O_3$, SnO, $B_2O_3$, and $Fe_2O_3$.

the crystallized glass frit (A) contains preferably 0 to 55% by mass, and more preferably 1 to 55% by mass, of $Ag_2O$ (A-1') in terms of oxides with respect to the total amount of the crystallized glass frit (A). Furthermore, the crystallized glass frit (A) contains preferably 0 to 60% by mass, and more preferably 1 to 60% by mass, of $TeO_2$ (A-2') in terms of oxides with respect to the total amount of the crystallized glass frit (A). In the crystallized glass frit (A), the total amount of $Ag_2O$ (A-1') and $TeO_2$ (A-2') is more preferably 50 to 100% by mass, even more preferably 65 to 100% by mass, and particularly preferably 75 to 100% by mass, with respect to the total amount of the crystallized glass frit (A). When the total amount of the component $Ag_2O$ (A-1') and the component $TeO_2$ (A-2') contained in the crystallized glass frit (A) is 50 to 100% by mass, a crystallized glass frit (A) having a relatively low remelting temperature (Tr) such that the remelting temperature (Tr) is higher than 350° C. and 450° C. or lower can be obtained.

In the crystallized glass frit (A), the mass ratio ($Ag_2O/TeO_2$) of $Ag_2O$ (A-1') to $TeO_2$ (A-2') is preferably 0.15 to 9.00. $Ag_2O$—$TeO_2$-based glass has a wide range of vitrification. That is, when the mass ratio ($Ag_2O/TeO_2$) of $Ag_2O$ (A-1') to $TeO_2$ (A-2') is in the range of 0.15 to 9.00, glass can be obtained. By setting the mass ratio ($Ag_2O/TeO_2$) of $Ag_2O$ (A-1') to $TeO_2$ (A-2') appropriately or by adding at least one type of oxide selected from the group consisting of $MoO_3$, $MnO_3$, ZnO, CuO, $TiO_2$, MgO, $Nb_2O_5$, BaO, $Al_2O_3$, SnO, $B_2O_3$, and $Fe_2O_3$, the crystallized glass frit (A) having a remelting temperature (Tr) of higher than 350° C. and 450° C. or lower can be obtained.

Solvent (B)

The glass paste used in the method of the present invention contains a solvent (B). As the solvent (B), one type or two or more types of solvents can be selected from alcohols (e.g., terpineol, α-terpineol, α-terpineol, and the like), esters (e.g., hydroxy group-containing esters, 2,2,4-trimethyl-1,3-pentanediol monoisobutyrate, butyl carbitol acetate, and the like), paraffin mixtures (e.g., Linpar, manufactured by Condea), and polyhydric alcohols (e.g., 2-ethyl-1,3-hexanediol) for use.

Besides the solvent, one type or two or more types of resins, binders, fillers, or the like may be added to the solvent to adjust the viscosity appropriate for applying the electrically conductive paste.

Electrically Conductive Particle (C)

The glass paste used in the method of the present invention preferably contains electrically conductive particles (C). As the electrically conductive particles (C), for example, silver (Ag), copper (Cu), nickel (Ni), silver alloys of silver (Ag) and a base metal (e.g., Cu, Ni, and the like), and the like can be used. Among these, the electrically conductive particle is preferably silver (Ag).

The shape and the average particle diameter of the electrically conductive particles are not particularly limited, and conventionally known shape and average particle diameter in this field can be employed. The average particle diameter of the electrically conductive particles is preferably 0.01 to 40 μm, more preferably 0.05 to 30 μm, and even more preferably 0.1 to 20 μm. When the average particle diameter of the electrically conductive particles is in the range of 0.01 to 40 μm, excellent dispersibility of the electrically conductive particles in the paste is achieved, and excellent sinterability during sintering is achieved. Note that, the average particle diameter of the electrically conductive particles refers to a volume cumulative distribution D50 (median diameter) measured using a laser diffraction/scattering particle diameter/particle size distribution measuring apparatus (e.g., MICROTRAC HRA9320-X100, manufactured by Nikkiso Co., Ltd.). The shape of the electrically conductive particles may be spherical, flake-like, scale-like, or polygonal shape.

When silver particles are used as the electrically conductive particles, nano-sized silver particles or silver particles in which a resin is filled in pores may be used.

Metal Oxide (D)

The glass paste used in the method of the present invention may further contain a metal oxide (D). Examples of the metal oxide include at least one type of metal oxide selected from a group consisting of SnO, ZnO, $In_2O_3$, and CuO. This metal oxide is not the oxide contained in the glass frit.

By allowing the glass paste to contain the at least one type of metal oxide selected from the group consisting of SnO, ZnO, $In_2O_3$, and CuO, even higher bonding strength can be achieved. By allowing the glass paste to contain the predetermined metal oxide, for example, a bonded body maintaining a bonding strength even in an environment at 300 to 350° C. can be obtained.

Other Additive

As other additives, additives selected from plasticizers, antifoaming agents, dispersing agents, leveling agents, stabilizing agents, adhesion promoting agents, and/or the like can be further blended in the glass paste used in the method of the present invention as necessary. Among these, the plasticizer can be selected from phthalic acid esters, glycolic acid esters, phosphoric acid esters, sebacic acid esters, adipic acid esters, citric acid esters, or the like for use.

Glass Paste

The glass paste used in the method of the present invention contains the crystallized glass frit (A) and the solvent (B). The proportion of the crystallized glass frit (A) in the glass paste is not particularly limited. In 100% by mass of the glass paste, preferably 50 to 99% by mass, more preferably 65 to 95% by mass, and even more preferably 75 to 95% by mass, of the crystallized glass fit (A) is contained. The proportion of the solvent (B) in the glass paste is not particularly limited. In 100% by mass of the glass paste, preferably 1 to 50% by mass, more preferably 5 to 40% by mass, and even more preferably 5 to 30% by mass, of the solvent (B) is contained.

When the proportion of the crystallized glass frit (A) in the glass paste is 50 to 99% by mass, a glass paste, in which the crystallized glass frit (A) is substantially uniformly dispersed in the solvent (B), can be obtained. When the proportion of the crystallized glass fit (A) in the glass paste is 50 to 99% by mass, the glass paste can be substantially uniformly applied to the first body to be bonded and/or the second body to be bonded. Furthermore, when the proportion of the crystallized glass frit (A) in the glass paste is within the range described above, the first body to be bonded and the second body to be bonded can be bonded at a relatively low temperature, such as a heating temperature of 450° C. or lower, and after the bonding, a bonded body in which bonding strength is maintained and which has excellent heat resistance can be obtained by the method of the present invention.

When the electrically conductive particles (C) are contained in the glass paste used in the method of the present invention, the glass paste preferably contains 5 to 35% by mass of the crystallized glass frit (A), 5 to 12% by mass of the solvent (B), and 60 to 90% by mass of the electrically conductive particles (C). Percent by mass of each component is a content of the each component per 100% by mass total of the glass paste.

The glass paste used in the method of the present invention preferably contains 5 to 35% by mass of the crystallized glass frit (A), 5 to 12% by mass of the solvent (B), and 60 to 90% by mass of the electrically conductive particles (C). In this case, by the step of heating to a temperature that is not lower than the crystallization temperature (Tc) and lower than the remelting temperature (Tr) of the crystallized glass frit (A), the first body to be bonded and the second body to be bonded can be bonded using the predetermined glass paste at a relatively low temperature, e.g., a heating temperature of 450° C. or lower. Furthermore, after the bonding of the first body to be bonded and the second body to be bonded, a bonded body in which bonding strength is maintained and which has excellent heat resistance can be obtained. Furthermore, with the glass paste containing the electrically conductive particles (C) used in the method of the present invention, the electrically conductive particles diffuse and deposit in the melted glass paste even at a relatively low temperature, e.g., a heating temperature of 450° C. or lower, in the step of heating to a temperature that is not lower than the crystallization temperature (Tc) and lower than the remelting temperature (Tr) of the crystallized glass fit (A). Therefore, a bonded body in which the first body to be bonded and the second body to be bonded are electrically connected can be obtained by forming a sintered film having excellent electrical conductivity using the predetermined glass paste.

When the metal oxide (D) is contained, the glass paste used in the method of the present invention preferably contains 5 to 35% by mass of the crystallized glass frit (A), 5 to 10% by mass of the solvent (B), 60 to 85% by mass of the electrically conductive particles (C), and 0 to 5% by mass of the metal oxide (D). Furthermore, more preferably, the glass paste used in the method of the present invention may contain 5 to 35% by mass of the crystallized glass fit (A), 5 to 10% by mass of the solvent (B), 60 to 85% by mass of the electrically conductive particles (C), and 0.1 to 5% by mass of the metal oxide (D). Percent by mass of each component is a content of the each component per 100% by mass total of the electrically conductive paste.

The glass paste preferably contains 5 to 35% by mass of the crystallized glass frit (A), 5 to 10% by mass of the solvent (B), 60 to 85% by mass of the electrically conductive particles (C), and 0 to 5% by mass of the metal oxide (D). In this case, by heating the first body to be bonded and the second body to be bonded, between which the glass paste is interposed, to a temperature that is not lower than the crystallization temperature (Tc) and lower than the remelting temperature (Tr) of the crystallized glass fit (A), the first body to be bonded and the second body to be bonded can be bonded firmly at a relatively low temperature, e.g., a heating temperature of 450° C. or lower. Furthermore, after the bonding of the first body to be bonded and the second body to be bonded, a bonded body in which bonding strength is maintained and which has excellent heat resistance can be obtained. Furthermore, with the glass paste containing the metal oxide (D) used in the method of the present invention, the electrically conductive particles diffuse and deposit in the melted glass paste even at a relatively low temperature, e.g., a heating temperature of 450° C. or lower, in the step of heating to a temperature that is not lower than the crystallization temperature (Tc) and lower than the remelting temperature (Tr) of the crystallized glass frit (A). Therefore, a bonded body in which the first body to be bonded and the second body to be bonded are electrically connected can be obtained by forming a sintered film having excellent electrical conductivity using the predetermined glass paste.

In the glass paste used in the method of the present invention, when the electrically conductive particles (C) are contained, the mass ratio of the crystallized glass frit (A) to the electrically conductive particles (C) (crystallized glass frit (A):electrically conductive particles (C)) is preferably 50:50 to 2:98, more preferably 40:60 to 10:90, even more preferably 35:65 to 15:85, and particularly preferably 30:70 to 20:80. When the mass ratio of the crystallized glass frit (A) to the electrically conductive particles (C) (crystallized glass frit (A):electrically conductive particles (C)) is 50:50 to 2:98, by heating the glass paste to a temperature that is not lower than the crystallization temperature (Tc) and lower than the remelting temperature (Tr) of the crystallized glass frit (A), the first body to be bonded and the second body to be bonded can be bonded at a relatively low temperature, e.g., a heating temperature of 450° C. or lower. Therefore, after the bonding of the first body to be bonded and the second body to be bonded, a bonded body in which bonding strength is maintained and which has excellent heat resistance can be obtained.

Next, the manufacturing method of the glass paste used in the method of the present invention is described.

Method of Manufacturing Glass Paste

The glass paste used in the method of the present invention has a step of mixing the crystallized glass frit (A) and the solvent (B). When the glass paste contains the electrically conductive particles (C), the metal oxide (D), and, depending on the case, other additive and/or additive particles, production can be performed by, for example, adding the crystallized glass frit (A) to the solvent (B), and depending on the case, adding the electrically conductive particles (C), the metal oxide (D), and other additive and/or additive particles, then mixing, and dispersing.

The mixing can be performed by, for example, a planetary mixer. Furthermore, the dispersing can be performed by a three-roll mill. The methods of mixing and dispersing are not limited to these methods, and various publicly known methods can be used.

First Body to be Bonded and/or Second Body to be Bonded

Examples of the first body to be bonded and/or the second body to be bonded that are bonded by the method of the present invention include substrates, semiconductor chips, cover bodies, heat radiation members, and the like.

Examples of the bonded body obtained by the method of the present invention include bonded bodies in which the first body to be bonded is a substrate and the second body to be bonded is a semiconductor chip, bonded bodies in which the first body to be bonded is a substrate and the second body to be bonded is a cover body, and bonded bodies in which the first body to be bonded is a substrate or a semiconductor chip and the second body to be bonded is a heat radiation member.

Examples of the bonded body, in which the first body to be bonded is a substrate and the second body to be bonded is a semiconductor chip, includes a semiconductor device. Examples of the substrate include substrates formed from a ceramic selected from alumina, aluminum nitride, silicon nitride, or the like, and substrates formed from a metal selected from aluminum, copper, or the like. Examples of the semiconductor chip include semiconductor chips selected from Si, SiC, GaN, GaAs, or the like.

Examples of the bonded bodies in which the first body to be bonded is a substrate and the second body to be bonded is a cover body include semiconductor packages, electronic component packages such as SWA device, MEMS devices, high frequency modules, and the like. Examples of the substrate or the cover body each include those formed from a metal, glass, or ceramic.

Examples of the bonded bodies, in which the first body to be bonded is a substrate or a semiconductor chip and the second body to be bonded is a heat radiation member, includes a semiconductor device equipped with a heat radiation member and the like. Examples of the substrate include substrates formed from a ceramic selected from alumina, aluminum nitride, silicon nitride, or the like, and substrates formed from a metal selected from aluminum, copper, or the like. Examples of the semiconductor chip include semiconductor chips selected from Si, SiC, GaN, GaAs, or the like. Examples of the heat radiation member include radiators formed from a metal selected from aluminum, copper, or the like.

Method of Manufacturing Bonded Body

The method of manufacturing a bonded body of the present invention uses the glass paste containing a crystallized glass fit (A) and a solvent (B), the crystallized glass frit (A) having a glass transition temperature (Tg), a crystallization temperature (Tc), and a remelting temperature (Tr), the remelting temperature (Tr) being a temperature higher than the crystallization temperature (Tc), and the crystallization temperature (Tc) being a temperature higher than the glass transition temperature (Tg). The method of manufacturing a bonded body of the present invention includes a step of applying the glass paste to the first body to be bonded and/or the second body to be bonded. The method of manufacturing a bonded body of the present invention include a step of bonding the first body to be bonded and the second body to be bonded by interposing the glass paste therebetween. The method of manufacturing a bonded body of the present invention include a step of heating the first body to be bonded and the second body to be bonded that are bonded via the glass paste to a temperature that is not lower than the crystallization temperature (Tc) and lower than the remelting temperature (Tr) of the crystallized glass frit (A). A step of obtaining a bonded body by cooling the first body to be bonded and the second body to be bonded that are bonded via the glass paste to a temperature that is not higher than the glass transition temperature of the crystallized glass frit is included.

Since the method of manufacturing a bonded body of the present invention includes heating to a temperature that is not lower than the crystallization temperature (Tc) and lower than the remelting temperature (Tr) of the crystallized glass frit (A) contained in the glass paste, the first body to be bonded and the second body to be bonded that are bonded via the glass paste can be bonded at a relatively low temperature. Furthermore, the damage caused by heating the first body to be bonded and/or the second body to be bonded can be reduced. Furthermore, in the manufacturing method of the present invention, since the glass paste is heated to a temperature that is not lower than the crystallization temperature (Tc) and lower than the remelting temperature (Tr) of the crystallized glass frit (A), the first body to be bonded and the second body to be bonded can be bonded without remelting the crystallized molecular arrangement in the crystallized glass frit (A). Furthermore, heat resistance of the bonded body can be enhanced while the bonding strength can be maintained after the bonding since the glass paste contains the glass frit having, as a part thereof, a crystal in which the molecules are regularly arranged. The bonded body obtained by the manufacturing method of the present invention can maintain the bonding strength and can enhance the heat resistance even when the bonded body is placed in a relatively high temperature environment, e.g., 300° C.

In the step of applying the glass paste to the first body to be bonded and/or the second body to be bonded of the manufacturing method of the present invention, the method of application is not particularly limited. Examples of the method of applying the glass paste include methods using dispensing and/or printing. Furthermore, the method of application is not limited to dispensing and/or printing, and the glass paste can be applied by various conventionally known methods.

The step of heating the first body to be bonded and the second body to be bonded that are bonded via the glass paste to a temperature that is not lower than the crystallization temperature (Tc) and lower than the remelting temperature (Tr) of the crystallized glass frit (A) in the manufacturing method of the present invention is not particularly limited as long as it is at a temperature not lower than the crystallization temperature (Tc) and lower than the remelting temperature (Tr) of the crystallized glass frit (A). When the remelting temperature (Tr) of the crystallized glass frit (A) is higher than 350° C. and not higher than 450° C., the first body to be bonded and the second body to be bonded that are bonded via the glass paste is heated at a temperature lower than 450° C. Furthermore, when the crystallization temperature (Tc) of the crystallized glass frit (A) is 150° C. or higher and 350° C. or lower, the first body to be bonded and the second body to be bonded that are bonded via the glass paste is heated at a temperature of 150° C. or higher.

In the step of obtaining a bonded body by cooling the first body to be bonded and the second body to be bonded that are bonded via the glass paste to a temperature that is not higher than the glass transition temperature of the crystallized glass frit in the manufacturing method of the present invention, cooling to a temperature lower than the crystallization temperature (Tc) of the crystallized glass frit (A) is preferably performed, and cooling to a temperature not higher than the glass transition temperature (Tg) of the crystallized glass frit (A) is more preferably performed. When the crystallization temperature (Tc) of the crystallized glass frit (A) is 150° C. or higher and 350° C. or lower, the first body to be bonded and the second body to be bonded that are bonded via the glass paste is preferably cooled to a temperature of lower than 350° C. or even lower. When the glass transition temperature (Tg) of the crystallized glass frit (A) is 110° C. or higher and lower than 200° C., the first body to be bonded and the second body to be bonded that are bonded via the glass paste is preferably cooled to a temperature of lower than 200° C. or even lower.

EXAMPLES

The present invention is described below in detail using Examples and Comparative Examples; however, the present invention is not limited to these.

First, the crystallized glass frit (A) is described below. The crystallized glass flit (A) is not limited to the following Examples.

Crystallized Glass Frits 1 to 7

Table 1 shows the composition of each component of crystallized glass frits 1 to 7. The crystallized glass frit 1 was used in the manufacturing method of the Examples of the present invention. The crystallized glass frit 1 was substantially formed from $Ag_2O$ (A-1), $V_2O_5$ (A-2), $MoO_3$ (A-3), and CuO (A-4). The crystallized glass frit 7 was used in the manufacturing method of the Comparative Examples. The crystallized glass frit 7 was substantially formed from $Ag_2O$ (a-1), $V_2O_5$ (a-2), and $TeO_2$ (a-3). The crystallized glass frits 2 to 6 contained $Ag_2O$ and $TeO_2$ in the proportions and contained no $V_2O_5$. The unit for a numerical value of each component of the crystallized glass frits in Table 1 is in "% by mass".

Crystallized Glass Frits 8 to 51

Tables 2 to 7 show the composition of each component of crystallized glass flits 8 to 51. The crystallized glass frits 8 to 51 contained $Ag_2O$ (A-1) and $V_2O_5$ (A-2), and further contained at least one type selected from a group consisting of $TeO_2$, $MoO_3$, ZnO, CuO, $TiO_2$, $MnO_2$, MgO, $Nb_2O_5$, $Fe_2O_3$, BaO, and $P_2O_5$ in a manner shown in Tables 2 to 7. The unit for a numerical value of each component of the crystallized glass frits in Tables 2 to 7 is in "% by mass".

The manufacturing method of crystallized glass frits (A) 1 to 51 were as follows.

As the raw materials of each of the crystallized glass frits (A) 1 to 51, powders of oxides were weighed, mixed, and charged in a crucible (e.g., a porcelain crucible: high temperature porcelain, manufactured by Fisher Brand, size: 10 mL). The raw materials of crystallized glass frit charged in the crucible were placed, as they were in the crucible, in an oven (oven: JEL-BURN JM, Model: 335300, manufactured by JELENKO). The raw materials of the crystallized glass frit were heated to a melt temperature, which is shown as "Melt Temp (° C.)" in Tables 1 to 7, in the oven, and sufficiently melted while the melt temperature was maintained. Thereafter, the melted raw materials of the crystallized glass frit were removed from the oven as they were in the crucible, and the melted raw materials of the crystallized glass frit were uniformly stirred. The melted raw materials of the crystallized glass frit were then placed on two rotatable stainless steel rolls having a diameter of 1.86 inches at room temperature, and the two rolls were rotated using a motor (BODUNE. D.C. MOTOR 115V). At this time, the melted raw materials of the crystallized glass frit were cooled rapidly to the room temperature while kneaded, to form a plate glass. As the last step, the plate glass was crushed using a mortar.

Figure 2:
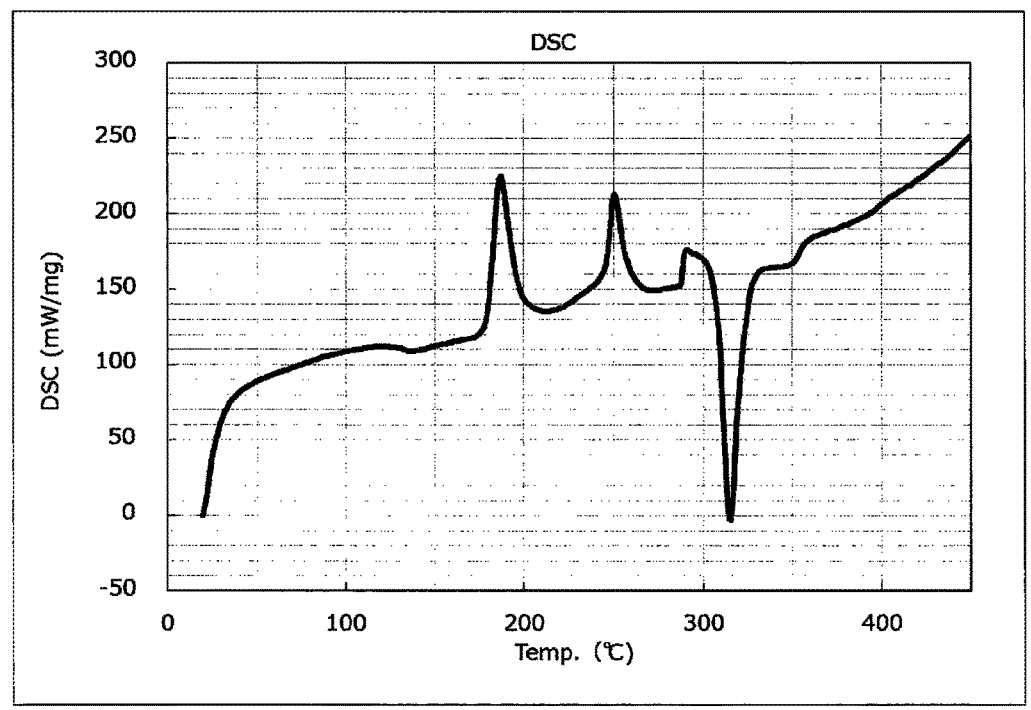
FIG. 2 is a DSC chart of a crystallized glass frit 7 used in the manufacturing method of a Comparative Example, measured using a differential scanning calorimeter.

Each of the crystallized glass frits 1 to 51 was subjected to DSC curve measurement using a differential scanning calorimeter under the following conditions. The glass transition temperature (Tg), crystallization temperature (Tc), and remelting temperature (Tr) were measured from the DSC curve obtained by differential scanning calorimetry. The glass transition temperature (Tg), crystallization temperature (Tc), and remelting temperature (Tr) of each of the crystallized glass frit are shown in Tables 1 to 7. FIG. 1 shows the DSC curve of the crystallized glass frit 1. FIG. 2 shows the DSC curve of the crystallized glass frit 7.

Glass Transition Temperature (Tg)

The DSC curve in a temperature region of approximately 50° C. to approximately 370° C. was measured by raising the temperature of the crystallized glass frit to 3780° C. at a rate of temperature increase of 15° C./min using a differential scanning calorimeter DSC-50, manufactured by Shimadzu. The first inflection point of the temperature in the DSC curve was used as the glass transition temperature (Tg).

Crystallization Temperature (Tc)

The temperature indicated by the peak top of at least one exothermic peak that was not less than 15 J/g of the exothermic quantity in the DSC curve obtained under condition of increasing the temperature to 370° C. with a rate of temperature increase of 15° C./min using a differential scanning calorimeter (DSC-50, manufactured by Shimadzu) was used as the crystallization temperature (Tc). When multiple exothermic peaks were present, the temperature (° C.) determined by the peak top of the first exothermic peak was used as Tc1, the temperature (° C.) determined by the peak top of the second exothermic peak was used as Tc2, the temperature (° C.) determined by the peak top of the third exothermic peak was used as Tc3, and the temperature (° C.) determined by the peak top of the fourth exothermic peak was used as Tc4. Furthermore, the size of each peak was indicated by the numerical value of the exothermic quantity (J/g).

Remelting Temperature (Tr)

The temperature indicated by the peak top of the endothermic peak at the lowest temperature in the DSC curve obtained under condition of increasing the temperature to 370° C. with a rate of temperature increase of 15° C./min using a differential scanning calorimeter (DSC-50, manufactured by Shimadzu) was used as the remelting temperature (Tr). When multiple endothermic peaks were present, the temperature (° C.) determined by the peak top of the first endothermic peak was used as Tr1, and the temperature (° C.) determined by the peak top of the second endothermic peak was used as Tr2. Furthermore, the size of each peak was indicated by the numerical value of the endothermic quantity (J/g).

TABLE 1

|  | Glass frit 1 | Glass frit 2 | Glass frit 3 | Glass frit 4 | Glass frit 5 | Glass frit 6 | Glass frit 7 |
|---|---|---|---|---|---|---|---|
| $Ag_2O$ | 56.21 | 43.87 | 43.02 | 42.25 | 43.18 | 50.70 | 63.50 |
| $V_2O_5$ | 25.79 | — | — | — | — | — | 21.90 |
| $TeO_2$ | — | 56.13 | 55.04 | 54.05 | 55.25 | 20.96 | 14.60 |
| $MoO_3$ | 10.00 | — | — | — | — | 28.34 | — |
| CuO | 8.00 | — | — | — | — | — | — |
| SnO | — | — | — | 3.69 | — | — | — |
| $B_2O_3$ | — | — | 1.94 | — | — | — | — |
| Total | 100 | 100 | 100 | 100 | 98.4 | 100 | 100 |
| $Ag_2O/V_2O_5$ | 2.18 | — | — | — | — | — | 2.90 |
| $Ag_2O/TeO_2$ | — | 0.78 | 0.78 | 0.78 | 0.78 | 2.42 | 4.35 |
| Melt Temp. (° C.) | 700 | 800 | 800 | 800 | 800 | 800 | 800 |
| Tg(° C.) | 178.9 | 165.8 | 174.67 | 172.6 | 172.09 | 185.78 | 126.9 |
| Tc1(° C.) | 231.9 | 212.1 | 243.17 | 238.09 | 219.88 | 238.39 | 185.4 |
| Tc1(J/g) | 46.7 | 8.19 | 19.35 | 14.7 | 10.94 | 25.7 | 27.1 |
| Tc2 (° C.) | 324.8 | 257.81 | 358.42 | 334.36 | 281.26 | 366.32 | 248.7 |
| Tc2(J/g) | 8.0 | 2.49 | 29.09 | 21.7 | 4.28 | 27.52 | 12.3 |
| Tc3(° C.) | — | 319.7 | 399.08 | 391.71 | 336.1 | 527.43 | — |
| Tc3(J/g) | — | 23.73 | 0.79 | 7.1 | 17.08 | 86.75 | — |
| Tc4(° C.) | — | — | — | — | 400.21 | — | — |
| Tc4(J/g) | — | — | — | — | 5.74 | — | — |
| Tr1 (° C.) | 412.7 | 443.5 | 438.2 | 444.77 | 442.61 | 390.7 | 313.2 |
| Tr1(J/g) | −73.51 | −46.3 | −69.72 | −41.14 | −29.21 | −8.07 | −36.51 |
| Tr2 (° C.) | — | — | — | — | — | 422.91 | — |
| Tr2(J/g) | — | — | — | — | — | −39.99 | — |
| Tc − Tg | 53 | 153.9 | 183.75 | 161.76 | 164.01 | 52.61 | 58.5 |
| Tr − Tc | 180.8 | 123.8 | 79.78 | 110.41 | 106.5 | 152.31 | 127.8 |

TABLE 2

|  | Glass frit 8 | Glass frit 9 | Glass frit 10 | Glass frit 11 | Glass frit 12 | Glass frit 13 | Glass frit 14 | Glass frit 15 |
|---|---|---|---|---|---|---|---|---|
| $Ag_2O$ | 55.19 | 65.34 | 63.07 | 63.07 | 61.70 | 57.93 | 64.44 | 57.93 |
| $V_2O_5$ | 25.31 | 29.99 | 28.93 | 28.93 | 28.30 | 26.57 | 29.56 | 26.57 |
| $TeO_2$ | — | — | — | — | — | — | — | — |
| $MoO_3$ | 7.50 | — | — | — | — | 7.50 | — | 7.50 |
| ZnO | — | — | — | — | — | — | 2.00 | — |
| CuO | 12.00 | — | — | 8.00 | 10.00 | — | 4.00 | — |
| $TiO_2$ | — | — | — | — | — | — | — | — |
| $MnO_2$ | — | 4.67 | — | — | — | — | — | — |
| MgO | — | — | — | — | — | — | — | — |
| $Nb_2O_5$ | — | — | — | — | — | — | — | — |
| $Fe_2O_3$ | — | — | — | — | — | — | — | 8.00 |
| BaO | — | — | 8.00 | — | — | 8.00 | — | — |
| $P_2O_5$ | — | — | — | — | — | — | — | — |
| Total | 100 | 100 | 100 | 100 | 100 | 100 | 100 | 100 |
| $Ag_2O/V_2O_5$ | 2.18 | 2.18 | 2.18 | 2.18 | 2.18 | 2.18 | 2.18 | 2.18 |
| $Ag_2O/TeO_2$ | — | — | — | — | — | — | — | — |
| Melt Temp. (° C.) | 700 | 700 | 700 | 700 | 700 | 700 | 700 | 700 |
| Tg(° C.) | 192.46 | 140.20 | 153.72 | 157.62 | 151.76 | 153.39 | 150.38 | 163.56 |
| Tc1(° C.) | 236.81 | 189.98 | 210.14 | 213.49 | 203.19 | 215.90 | 194.35 | 201.36 |
| Tc1(J/g) | 41.27 | 28.96 | 27.68 | 31.16 | 39.46 | 23.10 | 22.68 | 33.95 |
| Tc2 (° C.) | 329.85 | 249.97 | 311.48 | — | 295.21 | 280.15 | 242.19 | — |
| Tc2(J/g) | 4.45 | 6.40 | 9.39 | — | 1.39 | 5.27 | 11.08 | — |
| Tc3(° C.) | — | — | — | — | — | — | 287.92 | — |
| Tc3(J/g) | — | — | — | — | — | — | 1.35 | — |
| Tc4(° C.) | — | — | — | — | — | — | — | — |
| Tc4(J/g) | — | — | — | — | — | — | — | — |
| Tr1 (° C.) | 409.64 | 384.01 | 379.00 | 370.57 | 370.47 | 370.18 | 369.78 | 367.87 |

TABLE 2-continued

|  | Glass frit 8 | Glass frit 9 | Glass frit 10 | Glass frit 11 | Glass frit 12 | Glass frit 13 | Glass frit 14 | Glass frit 15 |
|---|---|---|---|---|---|---|---|---|
| Tr1(J/g) | −40.55 | −72.24 | −47.79 | −46.42 | −47.37 | −70.21 | −52.73 | −48.84 |
| Tr2 (° C.) | 423.74 | — | — | — | — | — | — | 437.48 |
| Tr2(J/g) | −3.50 | — | — | — | — | — | — | −10.48 |
| Tc − Tg | 44.35 | 49.78 | 56.42 | 55.87 | 51.43 | 62.51 | 43.97 | 37.80 |
| Tr − Tc | 172.83 | 194.03 | 168.86 | 157.08 | 167.28 | 154.28 | 175.43 | 166.51 |

TABLE 3

|  | Glass frit 16 | Glass frit 17 | Glass frit 18 | Glass frit 19 | Glass frit 20 | Glass frit 21 | Glass frit 22 | Glass frit 23 |
|---|---|---|---|---|---|---|---|---|
| $Ag_2O$ | 63.07 | 65.50 | 62.73 | 65.20 | 60.67 | 57.93 | 62.04 | 60.67 |
| $V_2O_5$ | 28.93 | 30.10 | 28.77 | 29.80 | 27.83 | 26.57 | 28.46 | 27.83 |
| $TeO_2$ | — | — | — | — | — | — | — | — |
| $MoO_3$ | — | — | 7.50 | — | 7.50 | 7.50 | 7.50 | 7.50 |
| ZnO | 4.00 | 4.39 | — | — | — | — | — | — |
| CuO | 4.00 | — | — | — | — | — | 2.00 | — |
| $TiO_2$ | — | — | 1.00 | — | — | — | — | — |
| $MnO_2$ | — | — | — | — | — | — | — | — |
| MgO | — | — | — | — | — | — | — | — |
| $Nb_2O_5$ | — | — | — | — | — | 8.00 | — | 4.00 |
| $Fe_2O_3$ | — | — | — | — | — | — | — | — |
| BaO | — | — | — | — | 4.00 | — | — | — |
| $P_2O_5$ | — | — | — | 5.00 | — | — | — | — |
| Total | 100 | 100 | 100 | 100 | 100 | 100 | 100 | 100 |
| $Ag_2O/V_2O_5$ | 2.18 | 2.18 | 2.18 | 2.19 | 2.18 | 2.18 | 2.18 | 2.18 |
| $Ag_2O/TeO_2$ | — | — | — | — | — | — | — | — |
| Melt Temp. (° C.) | 700 | 700 | 700 | 700 | 700 | 700 | 700 | 700 |
| Tg(° C.) | 151.41 | 133.92 | 151.06 | 151.37 | 151.27 | 174.88 | 152.33 | 164.63 |
| Tc1(° C.) | 189.47 | 190.08 | 182.54 | 187.60 | 214.27 | 215.83 | 196.79 | 222.68 |
| Tc1(J/g) | 25.43 | 40.02 | 33.24 | 37.92 | 34.74 | 29.72 | 42.29 | 35.69 |
| Tc2 (° C.) | 225.65 | 261.74 | — | 269.88 | 264.18 | — | 290.65 | — |
| Tc2(J/g) | 8.61 | 3.60 | — | 26.40 | 3.00 | — | 2.33 | — |
| Tc3(° C.) | — | — | — | — | 300.46 | — | — | — |
| Tc3(J/g) | — | — | — | — | 2.13 | — | — | — |
| Tc4(° C.) | — | — | — | — | — | — | — | — |
| Tc4(J/g) | — | — | — | — | — | — | — | — |
| Tr1 (° C.) | 367.47 | 366.44 | 365.31 | 362.31 | 361.35 | 359.21 | 358.64 | 358.40 |
| Tr1(J/g) | −50.54 | −62.45 | −42.52 | −1.87 | −51.52 | −25.99 | −37.33 | −30.67 |
| Tr2 (° C.) | — | — | — | 410.00 | — | 416.87 | — | 411.03 |
| Tr2(J/g) | — | — | — | −83.39 | — | −31.71 | — | −21.84 |
| Tc − Tg | 38.06 | 56.16 | 31.48 | 36.23 | 63.00 | 40.95 | 44.46 | 58.05 |
| Tr − Tc | 178.00 | 176.36 | 182.77 | 174.71 | 147.08 | 143.38 | 161.85 | 135.72 |

TABLE 4

|  | Glass frit 24 | Glass frit 25 | Glass frit 26 | Glass frit 27 | Glass frit 28 | Glass frit 29 | Glass frit 30 | Glass frit 31 |
|---|---|---|---|---|---|---|---|---|
| $Ag_2O$ | 62.73 | 58.96 | 62.73 | 62.04 | 60.67 | 64.44 | 57.93 | 62.04 |
| $V_2O_5$ | 28.77 | 27.04 | 28.77 | 28.46 | 27.83 | 29.56 | 26.57 | 28.46 |
| $TeO_2$ | — | — | — | — | — | — | — | — |
| $MoO_3$ | 7.50 | 10.00 | 7.50 | 7.50 | 7.50 | 4.00 | 7.50 | 7.50 |
| ZnO | — | — | — | — | — | 2.00 | — | 2.00 |
| CuO | — | 4.00 | — | — | — | — | 8.00 | — |
| $TiO_2$ | — | — | — | — | — | — | — | — |
| $MnO_2$ | — | — | — | — | — | — | — | — |
| MgO | — | — | — | — | 4.00 | — | — | — |
| $Nb_2O_5$ | 1.00 | — | — | — | — | — | — | — |
| $Fe_2O_3$ | — | — | — | — | — | — | — | — |
| BaO | — | — | 1.00 | 2.00 | — | — | — | — |
| $P_2O_5$ | — | — | — | — | — | — | — | — |
| Total | 100 | 100 | 100 | 100 | 100 | 100 | 100 | 100 |
| $Ag_2O/V_2O_5$ | 2.18 | 2.18 | 2.18 | 2.18 | 2.18 | 2.18 | 2.18 | 2.18 |
| $Ag_2O/TeO_2$ | — | — | — | — | — | — | — | — |

TABLE 4-continued

|  | Glass frit 24 | Glass frit 25 | Glass frit 26 | Glass frit 27 | Glass frit 28 | Glass frit 29 | Glass frit 30 | Glass frit 31 |
|---|---|---|---|---|---|---|---|---|
| Melt Temp. (° C.) | 700 | 700 | 700 | 700 | 800 | 700 | 700 | 700 |
| Tg(° C.) | 151.47 | 165.03 | 148.19 | 151.21 | 190.91 | 139.87 | 172.43 | 150.62 |
| Tc1(° C.) | 181.55 | 229.27 | 180.67 | 189.44 | 265.45 | 192.93 | 229.70 | 195.46 |
| Tc1(J/g) | 33.71 | 43.21 | 35.61 | 36.09 | 31.56 | 32.42 | 43.32 | 38.61 |
| Tc2 (° C.) | — | — | 277.90 | 262.55 | 302.63 | 305.78 | — | — |
| Tc2(J/g) | — | — | 7.55 | 6.44 | 0.63 | 11.77 | — | — |
| Tc3(° C.) | — | — | — | — | — | — | — | — |
| Tc3(J/g) | — | — | — | — | — | — | — | — |
| Tc4(° C.) | — | — | — | — | — | — | — | — |
| Tc4(J/g) | — | — | — | — | — | — | — | — |
| Tr1 (° C.) | 356.60 | 355.99 | 353.02 | 355.87 | 352.95 | 352.70 | 352.24 | 352.09 |
| Tr1(J/g) | −42.60 | −8.19 | −48.88 | −43.24 | −25.94 | −68.62 | −13.67 | −37.77 |
| Tr2 (° C.) | — | 408.98 | 387.18 | — | 401.27 | — | 406.49 | — |
| Tr2(J/g) | — | −65.79 | −5.37 | — | −4.12 | — | −36.61 | — |
| Tc − Tg | 30.08 | 64.24 | 32.48 | 38.23 | 74.54 | 53.06 | 57.27 | 44.84 |
| Tr − Tc | 175.05 | 126.72 | 172.35 | 166.43 | 87.50 | 159.77 | 122.54 | 156.63 |

TABLE 5

|  | Glass frit 32 | Glass frit 33 | Glass frit 34 | Glass frit 35 | Glass frit 36 | Glass frit 37 | Glass frit 38 | Glass frit 39 |
|---|---|---|---|---|---|---|---|---|
| $Ag_2O$ | 62.73 | 60.33 | 60.67 | 62.73 | 60.33 | 60.67 | 56.56 | 62.04 |
| $V_2O_5$ | 28.77 | 27.67 | 27.83 | 28.77 | 27.67 | 27.83 | 25.94 | 28.46 |
| $TeO_2$ | — | — | — | — | — | — | — | — |
| $MoO_3$ | 7.50 | 4.00 | 7.50 | 7.50 | 4.00 | 7.50 | 7.50 | 7.50 |
| ZnO | — | 8.00 | — | — | — | 2.00 | — | — |
| CuO | 1.00 | — | — | — | 8.00 | 2.00 | 10.00 | — |
| $TiO_2$ | — | — | — | — | — | — | — | — |
| $MnO_3$ | — | — | 4.00 | 1.00 | — | — | — | — |
| MgO | — | — | — | — | — | — | — | — |
| $Nb_2O_5$ | — | — | — | — | — | — | — | — |
| $Fe_2O_3$ | — | — | — | — | — | — | — | 2.00 |
| BaO | — | — | — | — | — | — | — | — |
| $P_2O_5$ | — | — | — | — | — | — | — | — |
| Total | 100 | 100 | 100 | 100 | 100 | 100 | 100 | 100 |
| $Ag_2O/V_2O_5$ | 2.18 | 2.18 | 2.18 | 2.18 | 2.18 | 2.18 | 2.18 | 2.18 |
| $Ag_2O/TeO_2$ | — | — | — | — | — | — | — | — |
| Melt Temp. (° C.) | 700 | 700 | 700 | 700 | 700 | 700 | 700 | 700 |
| Tg(° C.) | 149.29 | 152.74 | 149.39 | 163.50 | 164.95 | 157.81 | 183.48 | 158.26 |
| Tc1(° C.) | 182.58 | 216.90 | 184.53 | 228.34 | 222.62 | 225.76 | 230.20 | 209.46 |
| Tc1(J/g) | 36.42 | 37.15 | 33.90 | 38.46 | 35.13 | 42.76 | 41.26 | 36.43 |
| Tc2 (° C.) | — | 265.45 | — | 291.99 | 303.81 | 298.82 | — | 280.71 |
| Tc2(J/g) | — | 3.54 | — | 8.24 | 2.13 | 1.23 | — | 1.31 |
| Tc3(° C.) | — | — | — | — | — | — | — | — |
| Tc3(J/g) | — | — | — | — | — | — | — | — |
| Tc4(° C.) | — | — | — | — | — | — | — | — |
| Tc4(J/g) | — | — | — | — | — | — | — | — |
| Tr1 (° C.) | 351.22 | 351.75 | 350.59 | 350.14 | 348.80 | 3496.83 | 346.22 | 346.01 |
| Tr1(J/g) | −43.45 | −54.15 | −9.76 | −10.62 | −52.55 | −32.33 | −5.07 | −56.15 |
| Tr2 (° C.) | — | — | 370.21 | 408.43 | — | — | 409.16 | — |
| Tr2(J/g) | — | — | −15.23 | −19.14 | — | — | −67.55 | — |
| Tc − Tg | 33.29 | 64.16 | 35.14 | 64.84 | 57.67 | 67.95 | 46.72 | 51.20 |
| Tr − Tc | 168.64 | 134.85 | 166.06 | 121.80 | 126.18 | 121.07 | 116.02 | 136.55 |

TABLE 6

|  | Glass frit 40 | Glass frit 41 | Glass frit 42 | Glass frit 43 | Glass frit 44 | Glass frit 45 | Glass frit 46 | Glass frit 47 |
|---|---|---|---|---|---|---|---|---|
| $Ag_2O$ | 59.30 | 59.30 | 59.22 | 60.67 | 63.07 | 57.93 | 55.19 | 56.56 |
| $V_2O_5$ | 27.20 | 27.20 | 22.78 | 27.83 | 28.93 | 26.57 | 25.31 | 25.94 |
| $TeO_2$ | — | — | — | — | — | — | — | — |
| $MoO_3$ | 7.50 | 7.50 | 10.00 | 7.50 | 4.00 | 7.50 | 7.50 | 7.50 |
| ZnO | 4.00 | 2.00 | 8.00 | — | 4.00 | 4.00 | 8.00 | 10.00 |

TABLE 6-continued

|  | Glass frit 40 | Glass frit 41 | Glass frit 42 | Glass frit 43 | Glass frit 44 | Glass frit 45 | Glass frit 46 | Glass frit 47 |
|---|---|---|---|---|---|---|---|---|
| CuO | 2.00 | 4.00 | — | — | — | 4.00 | 4.00 | — |
| $TiO_2$ | — | — | — | — | — | — | — | — |
| $MnO_2$ | — | — | — | — | — | — | — | — |
| MgO | — | — | — | — | — | — | — | — |
| $Nb_2O_5$ | — | — | — | — | — | — | — | — |
| $Fe_2O_3$ | — | — | — | 4.00 | — | — | — | — |
| BaO | — | — | — | — | — | — | 0.00 | — |
| $P_2O_5$ | — | — | — | — | — | — | — | — |
| Total | 100 | 100 | 100 | 100 | 100 | 100 | 100 | 100 |
| $Ag_2O/V_2O_5$ | 2.18 | 2.18 | 2.60 | 2.18 | 2.18 | 2.18 | 2.18 | 2.18 |
| $Ag_2O/TeO_2$ | — | — | — | — | — | — | — | — |
| Melt Temp. (° C.) | 700 | 700 | 700 | 700 | 700 | 700 | 700 | 700 |
| Tg(° C.) | 164.41 | 162.98 | 161.15 | 158.86 | 144.69 | 167.40 | 181.31 | 159.50 |
| Tc1(° C.) | 225.37 | 218.00 | 215.67 | 208.84 | 206.98 | 219.98 | 224.89 | 227.59 |
| Tc1(J/g) | 41.68 | 43.37 | 41.78 | 37.51 | 42.24 | 40.71 | 33.97 | 36.72 |
| Tc2 (° C.) | 301.36 | — | 313.85 | — | 303.17 | 321.83 | 254.53 | 256.23 |
| Tc2(J/g) | 0.70 | — | 7.49 | — | 2.09 | 3.96 | 1.38 | 2.48 |
| Tc3(° C.) | — | — | — | — | — | — | 325.99 | 287.23 |
| Tc3(J/g) | — | — | — | — | — | — | 3.87 | 0.53 |
| Tc4(° C.) | — | — | — | — | — | — | — | — |
| Tc4(J/g) | — | — | — | — | — | — | — | — |
| Tr1 (° C.) | 345.18 | 345.00 | 344.89 | 344.86 | 343.64 | 342.85 | 341.92 | 341.67 |
| Tr1(J/g) | −36.83 | −28.51 | −33.99 | −70.52 | −66.86 | −27.53 | −23.07 | −31.46 |
| Tr2 (° C.) | 395.22 | 401.14 | — | — | — | 400.09 | 388.34 | — |
| Tr2(J/g) | −20.98 | — | — | — | — | −21.75 | −2.20 | — |
| Tc − Tg | 60.96 | 55.02 | 54.52 | 49.98 | 62.29 | 52.58 | 43.58 | 68.09 |
| Tr − Tc | 119.81 | 127.00 | 129.22 | 136.02 | 136.65 | 122.87 | 117.03 | 114.08 |

TABLE 7

|  | Glass frit 48 | Glass frit 49 | Glass frit 50 | Glass frit 51 |
|---|---|---|---|---|
| $Ag_2O$ | 55.19 | 62.73 | 62.04 | 65.81 |
| $V_2O_5$ | 25.31 | 28.77 | 28.46 | 30.19 |
| $TeO_2$ | — | — | — | 4.00 |
| $MoO_3$ | 7.50 | 7.50 | 7.50 | — |
| ZnO | 12.00 | 1.00 | — | — |
| CuO | — | — | — | — |
| $TiO_2$ | — | — | — | — |
| $MnO_2$ | — | — | — | — |
| MgO | — | — | — | — |
| $Nb_2O_5$ | — | — | 2.00 | — |
| $Fe_2O_3$ | — | — | — | — |
| BaO | — | — | — | — |
| $P_2O_5$ | — | — | — | — |
| Total | 100 | 100 | 100 | 100 |
| $Ag_2O/V_2O_5$ | 2.18 | 2.18 | 2.18 | 2.18 |
| $Ag_2O/TeO_2$ | — | — | — | 16.45 |
| Melt Temp. (° C.) | 700 | 700 | 700 | 700 |
| Tg(° C.) | 161.63 | 149.23 | 156.20 | 125.96 |
| Tc1 (° C.) | 223.90 | 182.16 | 189.82 | 163.45 |
| Tc1 ( J/g) | 34.59 | 37.56 | 34.20 | 36.40 |
| Tc2 (° C.) | 254.12 | — | — | 255.98 |
| Tc2 (J/g) | 3.46 | — | — | 4.04 |
| Tc3 (° C.) | — | — | — | — |
| Tc3 (J/g) | — | — | — | — |
| Tc4 (° C.) | — | — | — | — |
| Tc4 (J/g) | — | — | — | — |
| Tr1 (° C.) | 341.61 | 341.45 | 338.87 | 304.99 |
| Tr1 (J/g) | −31.10 | −43.54 | −23.47 | −16.53 |
| Tr2 (° C.) | — | — | 396.40 | 359.11 |
| Tr2 (J/g) | — | — | −28.65 | −46.21 |
| Tc-Tg | 62.27 | 32.93 | 33.62 | 37.49 |
| Tr-Tc | 117.71 | 159.29 | 149.05 | 141.54 |

The crystallization temperature (Tc) of the crystallized glass frit 1 used in the Examples had the temperature of Tc1 (exothermic quantity: 46.7 J/g) of 231.9° C. Furthermore, the crystallization temperature of the crystallized glass frit 7 used in the Comparative Examples had the temperature of Tc1 (exothermic quantity: 27.1 J/g) of 185.4° C.

Next, a glass paste 1 used in the manufacturing method of the Examples and a glass paste 2 used in the manufacturing method of the Comparative Examples were produced using the crystallized glass frits 1 and 7 and raw materials as follows.

Material of Glass Paste

Materials of the glass pastes are as follows. Table 8 shows the compositions of the glass pastes 1 and 2 used in the Examples and the Comparative Examples.

Electrically conductive particles: Ag, spherical, BET value: 0.6 m²/g, average particle diameter D50: 6.4 μm, 6 g (71.59% by mass per 100% by mass of the glass paste), trade name: EA-0001 (manufactured by Metalor). The average particle diameter of the electrically conductive particles refers to a volume cumulative distribution D50 (median diameter) measured using a laser diffraction/scattering particle diameter/particle size distribution measuring apparatus (e.g., MICROTRAC HRA9320-X100, manufactured by Nikkiso Co., Ltd.).

Solvent: Terpineol: 0.88 g (manufactured by Aldrich, product name: Terpineol, 10.48% by mass per 100% by mass of the electrically conductive paste)

Crystallized glass frits 1 and 7: As each of the crystallized glass frits, one type of glass frit was crushed using a mortar and classified using a 325 mesh sieve, and the classified substance was used. The average particle diameter (D50) after the crystallized glass frit was classified using a sieve was approximately 13 μm to approximately 20 μm.

TABLE 8

|  |  | Glass paste 1 used in Examples | Glass paste 2 used in Comparative Examples |
|---|---|---|---|
| Electrically conductive particle | Silver powder EA-0001 | 71.59 | 71.59 |
| Crystallized glass frit 1 |  | 17.93 | — |
| Crystallized glass frit 7 |  | — | 17.93 |
| Solvent | terpineol Terpineol | 10.48 | 10.48 |
| Total |  | 100.00 | 100.00 |

Method of Manufacturing Glass Paste

The materials of the glass paste with the composition shown in Table 8 were kneaded using a three-roll mill to produce a glass paste.

Examples

As the first body to be bonded, an alumina plate having the length of 20 mm, the width of 20 mm, and the thickness of 1 mm was used as a substrate. As the second body to be bonded, a Si chip having the length of 5 mm, the width of 5 mm, and the thickness of 330 μm was used.

On the substrate, which was the first body to be bonded, 2.5 μL of the glass paste 1 was dispensed, and the Si chip, which was the second body to be bonded, was mounted on the glass paste to bond the alumina plate which was the first body to be bonded and the Si chip which was the second body to be bonded. Using a spacer, a load was applied on the Si chip in a manner that the thickness of the glass paste 1 interposed between the first body to be bonded and the second body to be bonded became 30 μm. The alumina plate and the Si chip between which the glass paste 1 was interposed were heated at 370° C. for 15 minutes. The heating temperature of 370° C. was a temperature that was not lower than the crystallization temperature (Tc1) of 231.9° C. and lower than the remelting temperature (Tr1) of 412.7° C. of the crystallized glass frit 1 contained in the glass paste 1. Thereafter, the alumina plate and the Si chip between which the glass paste 1 was interposed was cooled to 25° C. or lower which was not higher than the glass transition temperature of the crystallized glass frit, thereby obtaining bonded bodies 1 to 5 for testing.

Comparative Examples

Bonded bodies 1 to 5 for testing were obtained by the same manner as in Examples except for using the glass paste 2. The heating temperature of 370° C. was a temperature that was not lower than the crystallization temperature (Tc1) of 185.4° C. and that was not lower the remelting temperature (Tr1) of 313.2° C. of the crystallized glass frit 7 contained in the glass paste 2. The bonded bodies 1 to 5 for testing obtained by the manufacturing method of the Comparative Examples do not satisfy a step of heating the first body to be bonded and the second body to be bonded that were bonded via the glass paste to a temperature that was not lower than the crystallization temperature (Tc) and lower than the remelting temperature (Tr) of the crystallized glass frit (A).

Shearing Test (Bonding Strength)

The bonded bodies 1 and 2 for testing of the Examples and the Comparative Examples were placed in an environment at the ambient temperature of 25° C., and after 30 seconds, shear strength test was performed at a shearing rate of 12 mm/min using a desktop force tester 1605 HTP, manufactured by Aikoh Engineering Co., Ltd., to measure the shear strength (Kgf/mm$^2$).

Furthermore, the bonded bodies 3 to 5 for testing were placed in an environment at 300° C., and after 30 seconds, shear strength test was performed at a shearing rate of 12 mm/min using a desktop force tester 1605 HTP, manufactured by Aikoh Engineering Co., Ltd., to measure the shear strength (Kgf/mm$^2$). The results are shown in Table 9 and FIG. 3.

TABLE 9

|  | Measurement temperature | Examples Shear strength (Kgf/mm$^2$) | Comparative Examples Shear strength (Kgf/mm$^2$) |
|---|---|---|---|
| Bonded body 1 | Ambient temperature 25° C. | 1.03 | 1..07 |
| Bonded body 2 | Ambient temperature 25° C. | 1.38 | 0.91 |
| Bonded body 3 | 300° C. | 1.30 | 0.62 |
| Bonded body 4 | 300° C. | 1.33 | 1.17 |
| Bonded body 5 | 300° C. | 1.37 | 0.59 |

Figure 3:
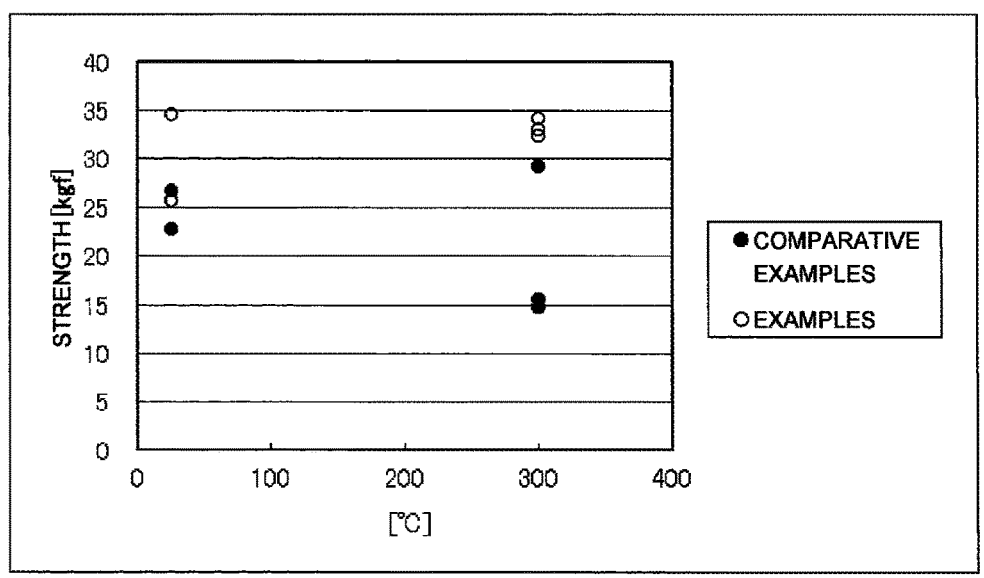
FIG. 3 is a chart showing the relationship between shear strength and environmental temperature of the bonded bodies 1 to 5 obtained by the manufacturing method of the Examples and the bonded bodies 1 to 5 obtained by the manufacturing method of the Comparative Examples.

As shown in FIG. 3 and Table 9, the bonded bodies 1 and 2 obtained by the manufacturing method of Examples, in which the bonded bodies were placed in an environment at the ambient temperature of 25° C., exhibited the same or superior shear strengths compared to the bonded bodies 1 and 2 of Comparative Examples. Furthermore, as shown in FIG. 3 and Table 9, all the bonded bodies 3 to 5 obtained by the manufacturing method of Examples, in which the bonded bodies were placed in an environment at 300° C., exhibited superior shear strengths compared to the bonded bodies 3 to 5 obtained by the manufacturing method of the Comparative Examples. From these results, it was confirmed that, in the bonded bodies 1 to 5 obtained by the manufacturing method of the present invention, the first body to be bonded and the second body to be bonded could be bonded at a relatively low temperature, e.g., a heating temperature of 450° C. or lower, and excellent heat resistance was exhibited after the bonding, by the step of heating the first body to be bonded and the second body to be bonded that are bonded via the glass paste to a temperature that is not lower than the crystallization temperature (Tc) and lower than the remelting temperature (Tr) of the crystallized glass frit (A). In particular, it was confirmed that the bonded bodies 3 to 5 obtained by the manufacturing method of the present invention exhibited particularly excellent heat resistance when the bonded bodies were placed in an environment at a relatively high temperature of 300° C.

INDUSTRIAL APPLICABILITY

According to the manufacturing method of the present invention, the first body to be bonded and the second body to be bonded can be bonded at a relatively low temperature, such as a heating temperature of 450° C. or lower, and after the bonding, a bonded body having excellent heat resistance can be obtained. Since thermal damage applied to adherends can be suppressed by the bonding at a relatively low temperature according to the manufacturing method of the present invention, the manufacturing method of the present invention is industrially advantageous as a method to manufacture a bonded body of a semiconductor device and the like in which a substrate and a semiconductor chip are bonded, a bonded body of a semiconductor package in which a substrate and a cover body are bonded, an electronic package such as a SWA device, an MEMS device, a bonded body of a high frequency module and the like, and a bonded body of a semiconductor device and the like in which a substrate or a semiconductor chip and a heat radiation member are bonded.

The invention claimed is:

1. A method of manufacturing a bonded body in which a first body and a second body are bonded using a glass paste, the glass paste comprising a glass frit (A) and a solvent (B), the glass frit (A) having a glass transition temperature and a crystallization temperature, and after a crystallization of the glass frit, the resultant crystallized glass having a remelting temperature, the remelting temperature being a temperature higher than the crystallization temperature, and the crystallization temperature being a temperature higher than the glass transition temperature, the method comprising:

applying the glass paste on at least one of the first body and the second body, bonding the first body and the second body by interposing the glass paste therebetween, heating the first body and the second body that are bonded via the glass paste to a temperature that is not lower than the crystallization temperature and lower than the remelting temperature, and obtaining the bonded body by cooling the first body and the second body that are bonded via the glass paste to a temperature that is not higher than the glass transition temperature.

2. The method of manufacturing the bonded body according to claim 1, wherein the glass paste further comprises an electrically conductive particle (C).

3. The method of manufacturing the bonded body according to claim 1, wherein the remelting temperature is at least 300° C.

4. The method of manufacturing the bonded body according to claim 1, wherein a difference between the glass transition temperature and the crystallization temperature is 30° C. to 185° C.

5. The method of manufacturing the bonded body according to claim 1, wherein the crystallization temperature is 150° C. to 350° C.

6. The method of manufacturing the bonded body according to claim 1, wherein the glass transition temperature is at least 110° C. and lower than 200° C.

7. The method of manufacturing the bonded body according to claim 1, wherein the glass frit (A) comprises $Ag_2O$ and $V_2O_5$.

8. The method of manufacturing the bonded body according to claim 7, wherein the glass frit (A) further comprises at least one oxide selected from the group consisting of $TeO_2$, $MoO_3$, $MnO_3$, $ZnO$, $CuO$, $TiO_2$, $MgO$, $Nb_2O_5$, $BaO$, $Al_2O_3$, $SnO$ and $Fe_2O_3$.

9. The method of manufacturing the bonded body according to claim 7, wherein the glass frit (A) further comprises a total amount of 80 to 96% by mass of $Ag_2O$ (A-1) and $V_2O_5$ (A-2) in terms of oxides with respect to the total mass of the glass frit, and a mass ratio ($Ag_2O/V_2O_5$) of $Ag_2O$ (A-1) to $V_2O_5$ (A-2) is 1.8 to 3.2.

10. The method of manufacturing the bonded body according to claim 1, wherein the glass frit (A) comprises $Ag_2O$ and $TeO_2$.

11. The method of manufacturing the bonded body according to claim 10, wherein the glass frit (A) further comprises at least one oxide selected from the group consisting of $MoO_3$, $MnO_3$, $ZnO$, $CuO$, $TiO_2$, $MgO$, $Nb_2O_5$, $BaO$, $Al_2O_3$, $SnO$, $B_2O_3$ and $Fe_2O_3$.

12. The method of manufacturing the bonded body according to claim 1, wherein the first body is a substrate and the second body is a semiconductor chip.

13. The method of manufacturing the bonded body according to claim 1, wherein the first body is a substrate and the second body is a cover body.

14. The method of manufacturing the bonded body according to claim 1, wherein the first body is a substrate and the second body is a heat radiation member.

15. The method of manufacturing the bonded body according to claim 1, wherein the first body is a semiconductor chip and the second body is a heat radiation member.

16. The method of manufacturing the bonded body according to claim 2, wherein the remelting temperature is at least 300° C.

17. The method of manufacturing the bonded body according to claim 2, wherein a difference between the glass transition temperature and the crystallization temperature is 30° C. to 185° C.

18. The method of manufacturing the bonded body according to claim 2, wherein the crystallization temperature is 150° C. to 350° C.

19. The method of manufacturing the bonded body according to claim 2, wherein the glass transition temperature is at least 110° C. and lower than 200° C.

* * * * *